United States Patent
Lee et al.

(10) Patent No.: US 9,859,376 B2
(45) Date of Patent: Jan. 2, 2018

(54) SEMICONDUCTOR DEVICE AND METHOD OF FABRICATING THE SAME

(71) Applicant: Samsung Electronics Co., Ltd., Suwon-si (KR)

(72) Inventors: Han-ki Lee, Hwaseong-si (KR); Jae-Young Park, Yongin-si (KR); Dong-Hun Lee, Daegu (KR); Bon-Young Koo, Suwon-si (KR); Sun-Young Lee, Yongin-si (KR); Jae-Jong Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 28 days.

(21) Appl. No.: 14/977,865

(22) Filed: Dec. 22, 2015

(65) Prior Publication Data

US 2016/0293705 A1 Oct. 6, 2016

(30) Foreign Application Priority Data

Apr. 6, 2015 (KR) ........................ 10-2015-0048199

(51) Int. Cl.
*H01L 29/10* (2006.01)
*H01L 29/78* (2006.01)
*H01L 29/786* (2006.01)
*H01L 29/423* (2006.01)
*H01L 29/66* (2006.01)
*H01L 29/06* (2006.01)
*H01L 29/775* (2006.01)

(52) U.S. Cl.
CPC ........ *H01L 29/1054* (2013.01); *H01L 29/068* (2013.01); *H01L 29/0673* (2013.01); *H01L 29/42392* (2013.01); *H01L 29/66795* (2013.01); *H01L 29/775* (2013.01); *H01L 29/785* (2013.01); *H01L 29/78696* (2013.01)

(58) Field of Classification Search
CPC ......... H01L 21/28255; H01L 21/28556; H01L 21/28079; H01L 21/043; H01L 21/048; H01L 27/1104; H01L 27/10826; H01L 29/785; H01L 29/6659; H01L 51/102
USPC ....... 257/200, 201, 249, 309, 347, 350, 401, 257/722, 744, 745, 754, E21.006, 257/E21.014, E21.061, E21.115, E21.126, 257/E21.127, E21.129, E21.17, E21.182, 257/E21.267, E21.32, E21.37, E21.421
See application file for complete search history.

(56) References Cited

U.S. PATENT DOCUMENTS

| | | | |
|---|---|---|---|
| 6,885,055 | B2 | 4/2005 | Lee |
| 6,995,051 | B1 | 2/2006 | Furukawa et al. |
| 7,005,700 | B2 | 2/2006 | Lee |
| 7,419,857 | B2 | 9/2008 | Choi et al. |

(Continued)

FOREIGN PATENT DOCUMENTS

| | | |
|---|---|---|
| EP | 2741320 | 6/2014 |
| WO | 2014051731 | 4/2014 |

*Primary Examiner* — Angel Roman
*Assistant Examiner* — Kevin Quinto
(74) *Attorney, Agent, or Firm* — Onello & Mello, LLP

(57) ABSTRACT

A semiconductor device and a method of fabricating the same are provided. The semiconductor device includes a multi-channel active pattern including germanium and an inner region and an outer region, the outer region formed along a profile of the inner region, and a germanium fraction of the outer region being smaller than a germanium fraction of the inner region. A gate electrode intersects the multi-channel active pattern.

18 Claims, 15 Drawing Sheets

(56) References Cited

U.S. PATENT DOCUMENTS

| | | |
|---|---|---|
| 7,494,902 B2 | 2/2009 | Jurczak et al. |
| 7,880,241 B2 | 2/2011 | Arnold et al. |
| 7,915,685 B2 | 3/2011 | Cohen |
| 7,972,916 B1 * | 7/2011 | Connelly ............. H01L 29/78 257/E21.542 |
| 7,972,968 B2 | 7/2011 | Lee et al. |
| 8,159,018 B2 | 4/2012 | Akil et al. |
| 8,394,690 B2 | 3/2013 | Ikeda et al. |
| 8,395,195 B2 | 3/2013 | Chang et al. |
| 8,410,519 B2 | 4/2013 | Xiong et al. |
| 8,426,283 B1 | 4/2013 | Wang et al. |
| 8,497,177 B1 | 7/2013 | Chang et al. |
| 8,609,499 B2 | 12/2013 | Ho et al. |
| 8,629,478 B2 | 1/2014 | Ko et al. |
| 8,653,599 B1 | 2/2014 | Cheng et al. |
| 8,697,502 B2 | 4/2014 | Cho |
| 8,772,102 B2 | 7/2014 | Chi |
| 8,785,909 B2 | 7/2014 | Radosavljevic et al. |
| 8,859,378 B2 | 10/2014 | Liang et al. |
| 8,865,552 B2 | 10/2014 | Mieno |
| 8,900,973 B2 | 12/2014 | Berliner et al. |
| 9,209,177 B2 * | 12/2015 | Kim ................. H01L 21/823431 |
| 2013/0320453 A1 * | 12/2013 | Pethe ................. H01L 29/66795 257/368 |
| 2014/0054547 A1 | 2/2014 | Eneman et al. |
| 2014/0077332 A1 | 3/2014 | Vincent et al. |
| 2014/0145248 A1 | 5/2014 | Cheng et al. |
| 2014/0151766 A1 | 6/2014 | Eneman et al. |
| 2014/0217483 A1 * | 8/2014 | Choi .................... H01L 29/785 257/288 |
| 2014/0264594 A1 | 9/2014 | Adam et al. |
| 2015/0279995 A1 * | 10/2015 | Maeda ................ H01L 29/7848 257/192 |
| 2015/0318399 A1 * | 11/2015 | Jeong ................. H01L 29/7853 257/401 |
| 2015/0357190 A1 * | 12/2015 | Chien ............... H01L 21/02532 257/623 |

\* cited by examiner

1200

1300

SEMICONDUCTOR DEVICE AND METHOD OF FABRICATING THE SAME

CROSS-REFERENCE TO RELATED APPLICATION

This application claims priority from Korean Patent Application No. 10-2015-0048199 filed on Apr. 6, 2015 in the Korean Intellectual Property Office, and all the benefits accruing therefrom under 35 U.S.C. 119, the contents of which in its entirety are herein incorporated by reference.

BACKGROUND

1. Technical Field

The present inventive concepts relate to a semiconductor device and a method of fabricating the same.

2. Description of the Related Art

As one of the scaling techniques for increasing the density of semiconductor devices, multi-gate transistors have been proposed, in which a fin- or nanowire-shaped multi-channel active pattern (or silicon body) is formed on a substrate and a gate is then formed on a surface of the multi-channel active pattern.

As the multi-gate transistors use a three-dimensional channel, scaling of the multi-gate transistors can be easily achieved. In addition, current control capacity can be improved even without increasing the length of the gate of the multi-gate transistors. Additionally, a short channel effect (SCE), in which an electric potential of a channel region is affected by a drain voltage, can be effectively suppressed.

SUMMARY

An embodiment of inventive concepts provides a semiconductor device, in which an occurrence of defects on a surface of a multi-channel active pattern is controlled, to thereby improve operating performance and reliability.

Another embodiment of inventive concepts provides a method of fabricating a semiconductor device, in which an occurrence of defects on a surface of a multi-channel active pattern is controlled, to thereby improve operating performance and reliability.

According to an aspect of inventive concepts, there is provided a semiconductor device comprising a multi-channel active pattern including germanium and an inner region and an outer region, the outer region being formed along a profile of the inner region, and a germanium fraction of the outer region being smaller than a germanium fraction of the inner region; and a gate electrode intersecting the multi-channel active pattern.

In some embodiments of inventive concepts, the germanium fraction of the outer region decreases in a direction away from the inner region.

In some embodiments of inventive concepts, the outer region includes a first part and a second part, the first part of the outer region is interposed between the inner region and the second part of the outer region, and a germanium fraction of the first part of the outer region decreases in a direction away from the inner region.

In some embodiments of inventive concepts, a germanium fraction of the second part of the outer region increases in a direction away from the inner region.

In some embodiments of inventive concepts, the germanium fraction of the second part of the outer region is constant.

In some embodiments of inventive concepts, the outer region includes an epitaxial layer formed along the profile of the inner region.

In some embodiments of inventive concepts, the germanium fraction of the inner region is constant in a width direction of the multi-channel active pattern.

In some embodiments of inventive concepts, the multi-channel active pattern includes silicon germanium.

In some embodiments of inventive concepts, a ratio of germanium to silicon in the inner region is greater than a ratio of germanium to silicon in the outer region.

In some embodiments of inventive concepts, the outer region of the multi-channel active pattern includes an outer surface of the multi-channel active pattern.

In some embodiments of inventive concepts, the multi-channel active pattern is a fin-type active pattern.

In some embodiments of inventive concepts, the multi-channel active pattern is a wire pattern.

According to another aspect of inventive concepts, there is provided a semiconductor device comprising a compound semiconductor layer; a silicon germanium fin-type pattern which protrudes from the compound semiconductor layer and which includes an inner region and an outer region, the outer region being formed along a profile of the inner region; and a gate electrode intersecting the silicon germanium fin-type pattern, on the compound semiconductor layer, wherein a germanium fraction of the inner region is constant, and a germanium fraction of the outer region is smaller than the germanium fraction of the inner region.

In some embodiments of inventive concepts, the germanium fraction of the outer region continuously decreases in a direction away from the inner region.

In some embodiments of inventive concepts, the outer region includes a first part and a second part, the first part of the outer region is interposed between the inner region and the second part of the outer region, and a germanium fraction of the first part of the outer region decreases in a direction away from the inner region.

In some embodiments of inventive concepts, a germanium fraction of the second part of the outer region increases in a direction away from the inner region.

In some embodiments of inventive concepts, the compound semiconductor layer includes silicon germanium.

In some embodiments of inventive concepts, a germanium fraction of the compound semiconductor layer is smaller than the germanium fraction of the inner region.

In some embodiments of inventive concepts, the semiconductor device may further comprise a field insulation layer formed on the compound semiconductor layer. At least a part of the silicon germanium fin-type pattern protrudes further upward than an upper surface of the field insulation layer.

In some embodiments of inventive concepts, the outer region is formed along the profile of the inner region protruding further upward than the upper surface of the field insulation layer.

According to still another aspect of inventive concepts, there is provided a semiconductor device comprising a compound semiconductor layer including silicon germanium; a silicon germanium fin-type pattern which protrudes from the compound semiconductor layer and which includes a lower pattern and an upper pattern sequentially stacked, the upper pattern including an inner region and an outer region formed along a profile of the inner region; and a gate electrode intersecting the silicon germanium fin-type pattern, on the compound semiconductor layer, wherein a germanium fraction of the inner region is constant, and the outer region includes a part having a germanium fraction smaller than the germanium fraction of the inner region.

In some embodiments of inventive concepts, a germanium fraction of the outer region continuously decreases in a direction away from the inner region.

In some embodiments of inventive concepts, the germanium fraction of the outer region decreases and then increases in a direction away from the inner region.

In some embodiments of inventive concepts, the germanium fraction of the inner region of the upper pattern is greater than a germanium fraction of the lower pattern.

In some embodiments of inventive concepts, the lower pattern is connected directly to the compound semiconductor layer.

In some embodiments of inventive concepts, the semiconductor may further comprise a field insulation layer formed on the compound semiconductor layer so as to cover side walls of the lower pattern.

In some embodiments of inventive concepts, the field insulation layer covers a whole of the sidewalls of the lower pattern.

According to still another aspect of inventive concepts, there is provided a method for fabricating a semiconductor device, the method comprising forming a pre silicon germanium fin-type pattern on a substrate; removing germanium from a surface region of the pre silicon germanium fin-type pattern so as to form a silicon germanium fin-type pattern; and forming a gate electrode on the substrate such that the gate electrode intersects the silicon germanium fin-type pattern.

In some embodiments of inventive concepts, the silicon germanium fin-type pattern is formed by performing a hydrogen plasma annealing process on the pre silicon germanium fin-type pattern.

In some embodiments of inventive concepts, the silicon germanium fin-type pattern includes an inner region and an outer region formed along a profile of the inner region, and a germanium fraction of the outer region is smaller than a germanium fraction of the inner region.

In some embodiments of inventive concepts, the outer region of the silicon germanium fin-type pattern is formed by removing germanium from the surface region of the pre silicon germanium fin-type pattern.

In some embodiments of inventive concepts, the germanium fraction of the inner region is same as a germanium fraction of the pre silicon germanium fin-type pattern.

In some embodiments of inventive concepts, forming a pre silicon germanium fin-type pattern includes forming, on the substrate, a compound semiconductor layer and a channel layer including silicon germanium, and after patterning a part of the compound semiconductor layer and the channel layer, forming a field insulation layer on the substrate.

In some embodiments of inventive concepts, the pre silicon germanium fin-type pattern includes a lower pattern contacting the field insulation layer and an upper pattern non-contacting the field insulation layer, and removing germanium from the surface region of the pre silicon germanium fin-type pattern removes germanium from a surface region of the upper pattern.

In example embodiments in accordance with principles of inventive concepts, a semiconductor device includes a multi-channel active pattern including silicon germanium in inner and outer regions, the outer region being formed along a profile of the inner region, wherein the silicon fraction of the outer region is greater than a silicon fraction of the inner region; and a gate electrode intersecting the multi-channel active pattern.

In example embodiments in accordance with principles of inventive concepts, the multi-channel active pattern is a fin-type active pattern.

In example embodiments in accordance with principles of inventive concepts, the outer region includes first and a second parts, wherein the first part of the outer region is interposed between the inner region and the second part of the outer region, and wherein a silicon fraction of the first part of the outer region increases in a direction away from the inner region.

In example embodiments in accordance with principles of inventive concepts, the outer region includes an epitaxial layer formed along the profile of the inner region.

In example embodiments in accordance with principles of inventive concepts, the silicon fraction of the inner region is constant in a width direction of the multi-channel active pattern.

BRIEF DESCRIPTION OF THE DRAWINGS

The above and other features and advantages of inventive concepts will become more apparent by describing in detail preferred embodiments thereof with reference to the attached drawings in which.

DETAILED DESCRIPTION OF THE EMBODIMENTS

Figure 1:
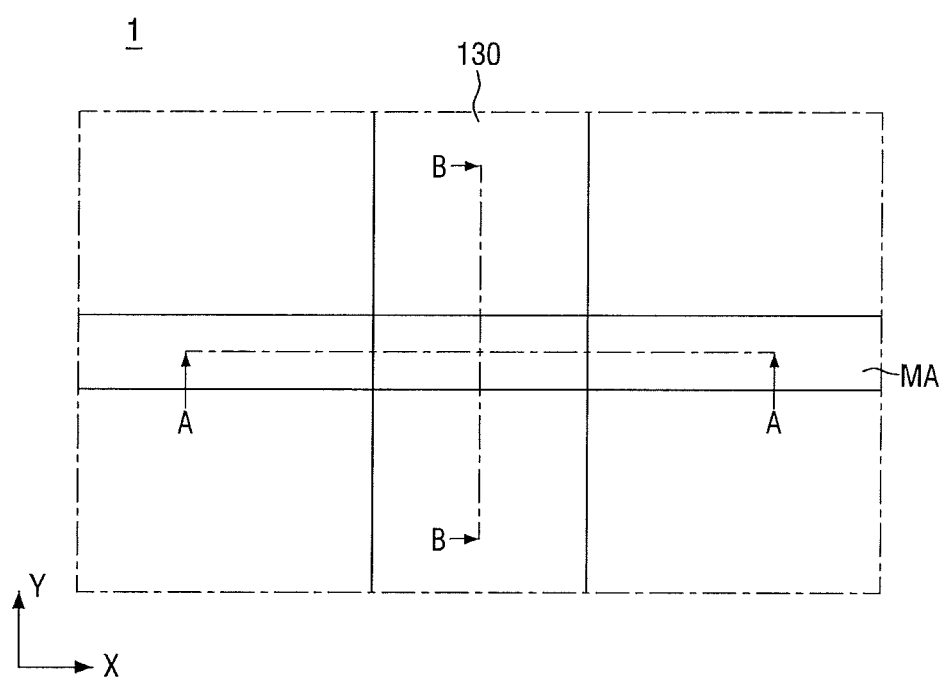
FIG. 1 is a layout diagram of a semiconductor device according to a first embodiment of inventive concepts.

The present inventive concepts will now be described more fully hereinafter with reference to the accompanying drawings, in which preferred embodiments of the inventive concepts are shown. Inventive concepts may, however, be embodied in different forms and should not be construed as limited to the embodiments set forth herein. Rather, these embodiments are provided so that this disclosure will be thorough and complete, and will fully convey the scope of inventive concepts to those skilled in the art. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concepts belongs. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

A semiconductor device according to a first example embodiment in accordance with principles of inventive concepts will hereinafter be described with reference to FIGS. 1 to 6.

Figure 2:
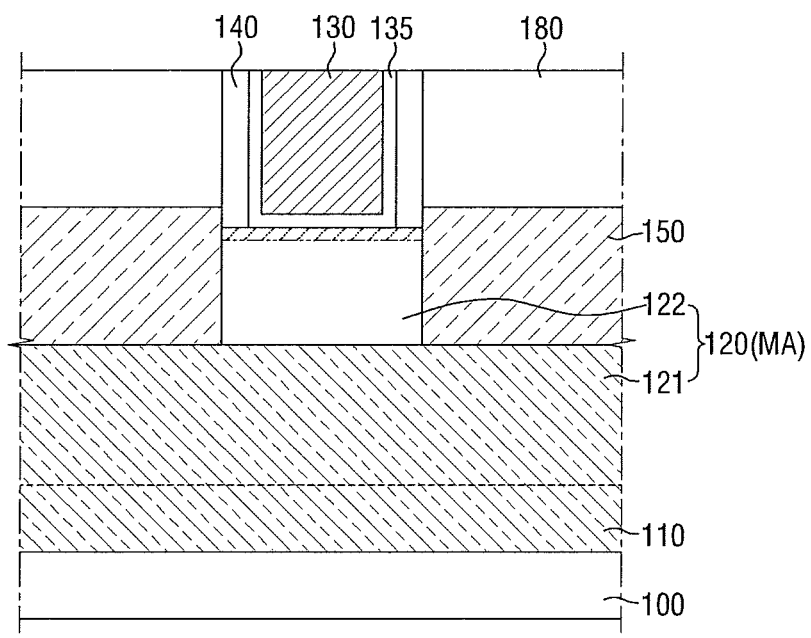
FIG. 2 is a cross-sectional view taken along the line A-A of FIG. 1.
Figure 3:
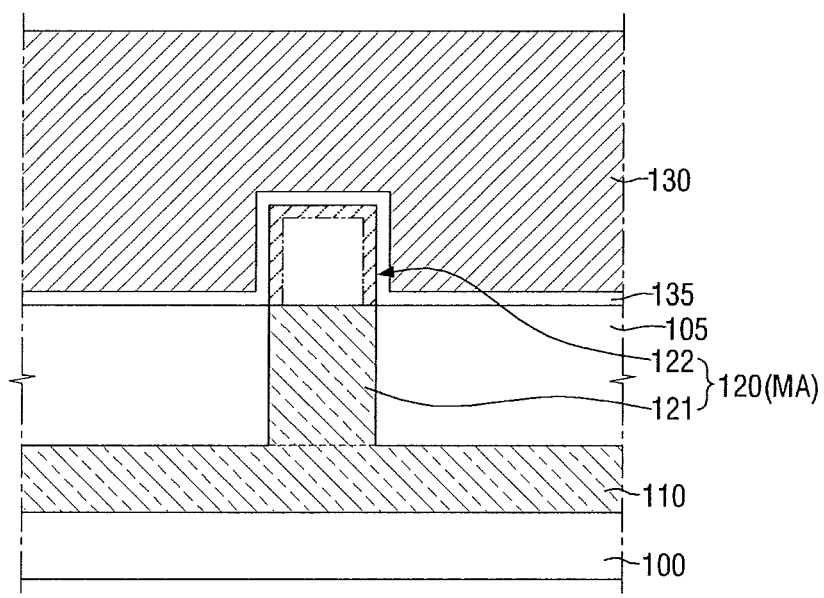
FIG. 3 is a cross-sectional view taken along the line B-B of FIG. 1.
Figure 4:
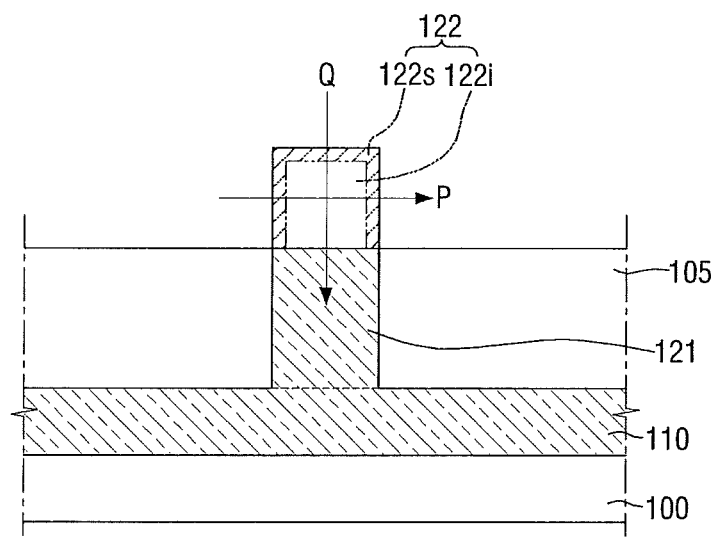
FIG. 4 is a diagram illustrating a semiconductor device excluding a gate electrode and a gate insulation layer from those shown in FIG. 3.
Figure 5:
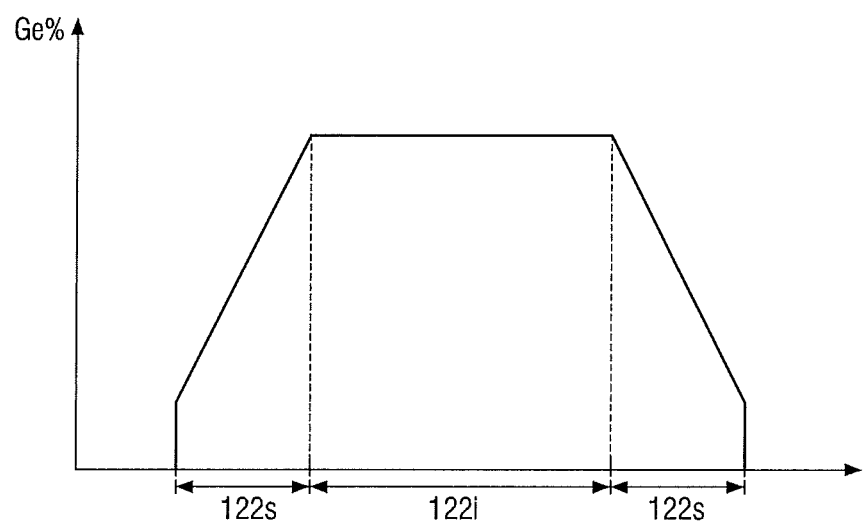
FIG. 5 is a graphical representation schematically illustrating a germanium fraction in P direction shown in FIG. 4.
Figure 6:
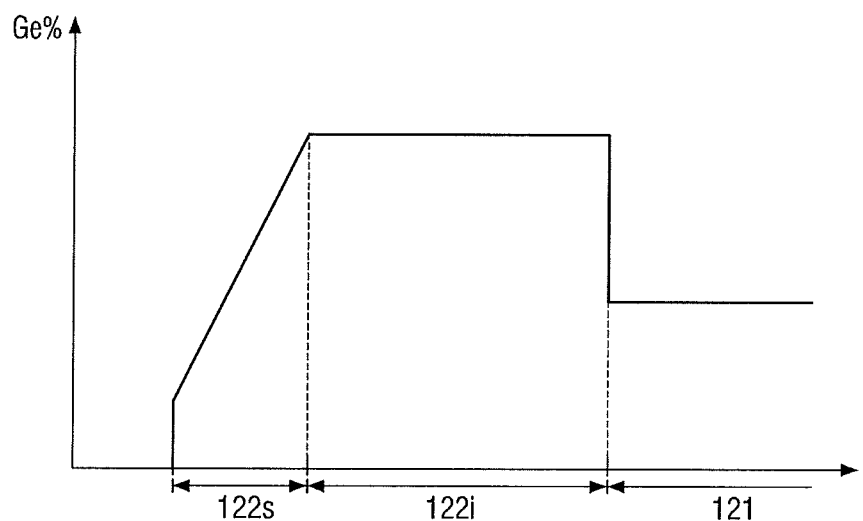
FIG. 6 is a graphical representation schematically illustrating a germanium fraction in Q direction shown in FIG. 4.

FIG. 1 is a layout diagram of a semiconductor device according to a first example embodiment in accordance with principles of inventive concepts. FIG. 2 is a cross-sectional view taken along the line A-A of FIG. 1. FIG. 3 is a cross-sectional view taken along the line B-B of FIG. 1. FIG. 4 is a diagram illustrating a semiconductor device excluding a gate electrode and a gate insulation layer from those shown in FIG. 3. FIG. 5 is a graphical representation schematically illustrating a germanium fraction in P direction shown in FIG. 4. FIG. 6 is a graphical representation schematically illustrating a germanium fraction in Q direction shown in FIG. 4.

Referring to FIGS. 1 to 6, a semiconductor device 1 according to a first embodiment in accordance with principles of inventive concepts may include a multi-channel active pattern MA and a gate electrode 130.

Substrate 100 may be, for example, bulk silicon or a silicon-on-insulator (SOI). Alternatively, the substrate 100 may be a silicon substrate or, may include other materials, for example, silicon germanium, a silicon-germanium-on-insulator (SGOI), silicon carbide, indium antimonide, lead telluride, indium arsenide, indium phosphide, gallium arsenide or gallium antimonide. Alternatively, the substrate 100 may be a base substrate on which an epitaxial layer is formed. In embodiments in accordance with principles of inventive concept, the substrate 100 is described as a silicon substrate.

A strain buffer layer 110 may be formed on the substrate 100. The strain buffer layer 110 may be, or include, a compound semiconductor. The strain buffer layer 110 may include, for example, a group IV-IV compound semiconductor or a group III-V compound semiconductor.

As an example of the group IV-IV compound semiconductor, the strain buffer layer 110 may be a binary compound or a ternary compound such as silicon germanium, including at least two of carbon (C), silicon (Si), germanium (Ge) and tin (Sn), or a binary or ternary compound doped with a group IV element.

As an example of the group Ill-V compound semiconductor, the strain buffer layer 110 may be a binary compound, a ternary compound or a quarternary compound prepared by combining at least one of aluminum (Al), gallium (Ga) and indium (In) as a group III element and at least one of phosphorus (P) and arsenic (As) as a group V element.

The strain buffer layer 110 may be formed on the substrate 100 through an epitaxial growth process. For example, the strain buffer layer 110 may be formed through an atmospheric pressure chemical vapor deposition (APCVD), low (or reduced) pressure chemical vapor deposition (LPCVD), ultra high vacuum chemical vapor deposition (UHV-CVD), molecular beam epitaxy (MBE), metal organic chemical vapor deposition (MOCVD), and the like, but inventive concepts are not limited thereto.

The strain buffer layer 110 may have a crystalline structure same as that of the substrate 100. In semiconductor devices according to embodiments of inventive concepts, a silicon substrate used as the substrate 100 has a diamond crystalline structure. Thus, the strain buffer layer 110 including a compound semiconductor may have a zinc-blende structure similar to a diamond crystalline structure.

The strain buffer layer 110 is depicted as a single layer, but inventive concepts are limited thereto. That is, the strain buffer layer 110 may include a plurality of layers. In addition, the strain buffer layer 110 may include a plurality of layers the lattice constant of which changes in a direction away from the substrate 100.

In an example embodiment of a semiconductor device in accordance with principles of inventive concepts, the strain buffer layer 110 is described as a silicon germanium layer.

A field insulation layer 105 may be formed on the strain buffer layer 110. The field insulation layer 105 may include, for example, but is not limited to, one of an oxide layer, a nitride layer, an oxynitride layer or a combination thereof.

The multi-channel active pattern MA may be formed on the substrate 100. More specifically, the multi-channel active pattern MA may be formed on the strain buffer layer 110.

In the semiconductor device 1 according to the first example embodiment in accordance with principles of inventive concepts, the multi-channel active pattern MA may be a fin-type active pattern 120. Accordingly, the fin-type active pattern 120 may protrude from the strain buffer layer 110.

Because the field insulation layer 105 covers a part of a sidewall of the fin-type active pattern 120, at least a part of the fin-type active pattern 120 may protrude further upward than the field insulation layer 105. That is, at least a part of an upper surface of the fin-type active pattern 120 may protrude further upward than an upper surface of the field insulation layer 105.

The fin-type active pattern 120 may be defined by the field insulation layer 105 and may extend along a first direction X.

The fin-type active pattern 120 may include a lower pattern 121 and an upper pattern 122 sequentially stacked on the substrate 100. The lower pattern 121 may protrude from the strain buffer layer 110. The upper pattern 122 may be formed on the lower pattern 121.

The upper pattern 122 may be positioned on the top of the fin-type active pattern 120. That is, the upper surface of the fin-type active pattern 120 may be an upper surface of the upper pattern 122.

Because the upper surface of the fin-type active pattern 120 protrudes further upward than the upper surface of the field insulation layer 105, at least a part of the upper pattern 122 may protrude further upward than the field insulation layer 105.

If, for example, the semiconductor device 1 is a transistor, the upper pattern 122 may be used as a channel region of the transistor.

Although the lower pattern 121 is depicted as being in contact with the field insulation layer 105 and the upper pattern 122 is depicted as not being in contact with the field insulation layer 105 in FIG. 3, it is merely for convenience of description and example embodiments in accordance with principles of inventive concepts are not limited thereto. That is, the field insulation layer 105 does not cover the whole of a sidewall of the lower pattern 121 but a part of the sidewall of the lower pattern 121 may protrude further upward than the upper surface of the field insulation layer 105.

In other example embodiments, a part of the upper pattern 122 may contact the field insulation layer 105, and the rest of the upper pattern 122 may contact further upward than the upper surface of the field insulation layer 105.

The upper pattern 122 may be directly connected to the lower pattern 121. That is, the upper pattern 122 may be formed to directly contact the lower pattern 121. For example, in example embodiments, the lower pattern 121 may be a base for an epitaxial growth of the upper pattern 122, and the upper pattern 122 may be an epitaxial layer formed on the lower pattern 121.

The fin-type active pattern 120 may include germanium. In the semiconductor device according to the first embodiment of inventive concepts, the fin-type active pattern 120 may be a silicon germanium fin-type pattern including silicon germanium.

Thus, the lower pattern 121 and the upper pattern 122 may include silicon germanium. However, a germanium fraction of the silicon germanium contained in the upper pattern 122 may differ from a germanium fraction of the silicon germanium contained in the lower pattern 121. This will be described in detail in the discussion related to FIGS. 5 and 6.

In the semiconductor device 1 according to the first embodiment of inventive concepts, the lower pattern 121 may be formed to be directly connected to the strain buffer layer 110. The lower pattern 121 may be a part of the strain buffer layer 110, for example.

In example embodiments, the lower pattern 121 and the strain buffer layer 110 may include silicon germanium having the same germanium fraction. In such embodiments, because the lower pattern 121 may be formed by etching a part of the strain buffer layer 110, the lower pattern 121 and the strain buffer layer 110 may be formed into an integral structure.

In other example embodiments, when the strain buffer layer 110 includes a plurality of layers whose the lattice constant changes in a direction away from the substrate 100, the germanium fraction of the silicon germanium contained in the lower pattern 121 may differ from the germanium fraction of the silicon germanium contained in the strain buffer layer 110.

The gate electrode 130 may extend in a second direction Y such that the gate electrode 130 intersects the multi-channel active pattern MA.

In the semiconductor device 1 according to the first embodiment of inventive concepts, because the multi-channel active pattern MA may be the fin-type active pattern 120, the gate electrode 130 may be formed on the fin-type active pattern 120 and the field insulation layer 105.

The gate electrode 130 may include, for example, at least one of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al) and tungsten (W).

The gate electrode 130 may be formed through, for example, a replacement process (or a gate last process), but example embodiments in accordance with principles of inventive concepts are not limited thereto.

A gate insulation layer 135 may be formed between the multi-channel active pattern MA and the gate electrode 130. That is, for example, the gate insulation layer 135 may be formed along a profile of the fin-type active pattern 120 protruding further upward than the field insulation layer 105. Additionally, the gate insulation layer 135 may be interposed between the gate electrode 130 and the field insulation layer 105.

The gate insulation layer 135 may include silicon oxide, silicon oxynitride, silicon nitride and a high dielectric constant material having a dielectric constant higher than that of silicon oxide. The high dielectric constant material may include, for example, one or more among hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but example embodiments in accordance with principles of inventive concepts are not limited thereto.

A gate spacer 140 may be formed on sidewalls of the gate electrode 130 extending in the second direction Y. The gate spacer 140 may include, for example, at least one of silicon nitride (SiN), silicon oxynitride (SiON), silicon oxide (SiO$_2$), silicon carbon oxynitride (SiOCN), silicon carbonitride (SiCN) and a combination thereof.

A source/drain 150 may be formed at both sides of the gate electrode 130. The source/drain 150 is depicted as being formed on the multi-channel active pattern MA, but example embodiments in accordance with principles of inventive concepts are not limited thereto. That is, when the multi-channel active pattern MA is the fin-type active pattern 120, the source/drain 150 may be formed on the multi-channel active pattern MA, for example.

The source/drain 150 is depicted as including an epitaxial layer which fills a recess formed in the fin-type active pattern 120 in FIG. 2, but example embodiments in accordance with principles of inventive concepts are not limited thereto. The source/drain 150 may include an epitaxial layer formed along sidewalls and upper surface of the fin-type active pattern 120 protruding further upward than the field insulation layer 105, or may be an impurity region formed in the fin-type active pattern 120 without an epitaxial layer.

An interlayer insulation layer 180 may be formed on the field insulation layer 105. The interlayer insulation layer 180 may cover the multi-channel active pattern MA, the source/drain 150, and the like.

The interlayer insulation layer 180 may include at least one of silicon oxide, silicon nitride, silicon oxynitride, and a low dielectric constant material having a dielectric constant lower than that of silicon oxide. The low dielectric constant may include, for example, flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, a porous polymeric material or a combination thereof, but example embodiments in accordance with principles of inventive concepts are not limited thereto.

In the semiconductor device 1 according to the first embodiment of inventive concepts, the upper pattern 122 may include an inner region 122*i* and an outer region 122*s*. The outer region 122*s* of the upper pattern 122 may be defined along a periphery of the inner region 122*i* of the upper pattern 122.

In other words, the outer region 122*s* of the upper pattern 122 may be formed along a profile of the inner region 122*i* of the upper pattern 122. For example, the outer region 122*s* of the upper pattern 122 may be formed along the profile of the inner region 122*i* of the upper pattern 122 protruding upward further than the upper surface of the field insulation layer 105.

The outer region 122*s* of the upper pattern 122 may include an outer surface of the fin-type active pattern 120. Because the gate insulation layer 135 may be formed along the profile of the fin-type active pattern 120 protruding further upward than the field insulation layer 105, the gate insulation layer 135 may be formed along the outer region 122*s* of the upper pattern 122.

The inner region 122*i* of the upper pattern 122 and the outer region 122*s* of the upper pattern 122 may be formed through a process of forming the upper pattern 122 and performing a heat-treatment on a surface region of the upper pattern 122, thereby dividing the upper pattern 122 into the inner region 122*i* of the upper pattern 122 and the outer region 122*s* of the upper pattern 122, for example.

In the semiconductor device 1 according to a first example embodiment in accordance with principles of inventive concepts, a germanium fraction of the inner region 122*i* of the upper pattern 122 may be constant. For example, the germanium fraction of the inner region 122*i* of the upper pattern 122 may be constant in a width direction of the fin-type active pattern 120 (the second direction Y in FIG. 1).

The upper pattern 122 may be used as a channel region of a semiconductor device. That is, the germanium fraction of the upper pattern 122 usable as a channel region may be made greater than the germanium fraction of the lower pattern 121, thereby improving mobility of charges in a channel and performance of a semiconductor element.

As a result, the germanium fraction of the upper pattern 122, more specifically, the germanium fraction of the inner region 122*i* of the upper pattern 122, may be greater than the germanium fraction of the lower pattern 121.

Additionally, because the lower pattern 121 may be a part of the strain buffer layer 110, the germanium fraction of the inner region 122*i* of the upper pattern 122 may be greater than the germanium fraction of the strain buffer layer 110. If the strain buffer layer 110 includes a plurality of layers having germanium fractions different from each other, the germanium fraction of the inner region 122*i* of the upper pattern 122 may be greater than an average germanium fraction of the strain buffer layer 110.

In semiconductor devices in accordance with principles of inventive concepts, the outer region 122*s* of the upper pattern 122 may include a part having a germanium fraction smaller than the germanium fraction of the inner region 122*i* of the upper pattern 122.

In the semiconductor device 1 according to the first example embodiment in accordance with principles of inventive concepts, the germanium fraction of the outer region 122*s* of the upper pattern 122 may decrease in a direction away from the inner region 122*i* of the upper pattern 122. More specifically, the germanium fraction of the outer region 122*s* of the upper pattern 122 may continuously decrease in a direction away from the inner region 122*i* of the upper pattern 122.

For example, the germanium fraction of the outer region 122*s* of the upper pattern 122 may be smaller than the germanium fraction of the inner region 122*i* of the upper pattern 122 as a whole.

In example embodiments the ratio of germanium to silicon in the inner region 122*i* of the upper pattern 122 may be greater than the ratio of germanium to silicon in the outer region 122*s* of the upper pattern 122. In other words, in example embodiments a silicon rich region may be formed in the outer region 122*s* of the upper pattern. The presence of the silicon rich region may prevent a buildup of germanium at an interface between the channel and gate insulation layer.

Although the germanium fraction of the outer region 122*s* of the upper pattern 122 is depicted as being greater than zero at a surface of the fin-type active pattern 120 in FIGS. 5 and 6, it is merely for convenience of description and example embodiments in accordance with principles of inventive concepts are not limited thereto.

In addition, although the germanium fraction of the outer region 122*s* of the upper pattern 122 is depicted as being linearly changed in FIGS. 5 and 6, it is merely for convenience of description and example embodiments in accordance with principles of inventive concepts are not limited thereto.

Figure 7:
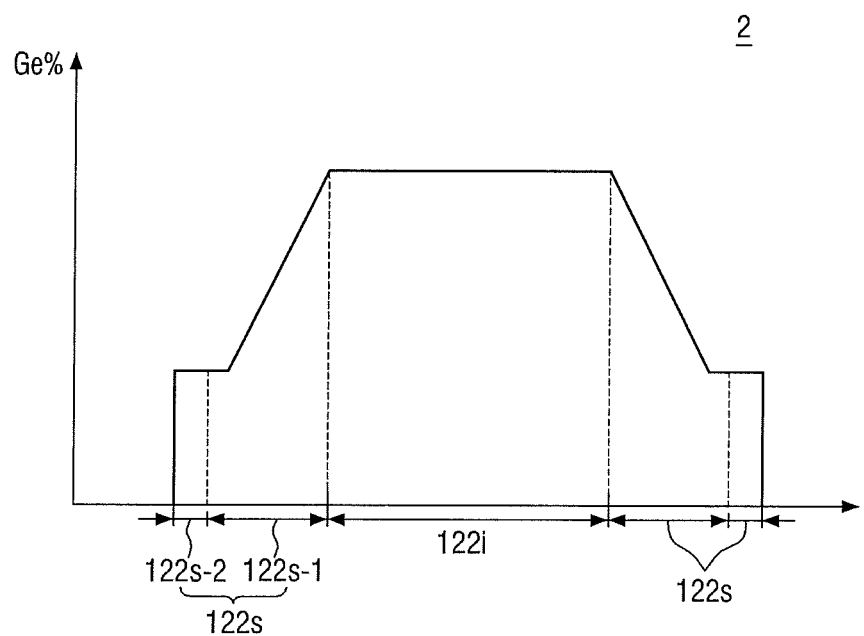
FIG. 7 is a graphical representation schematically illustrating a germanium fraction of a semiconductor device according to a second embodiment of inventive concepts.
Figure 8:
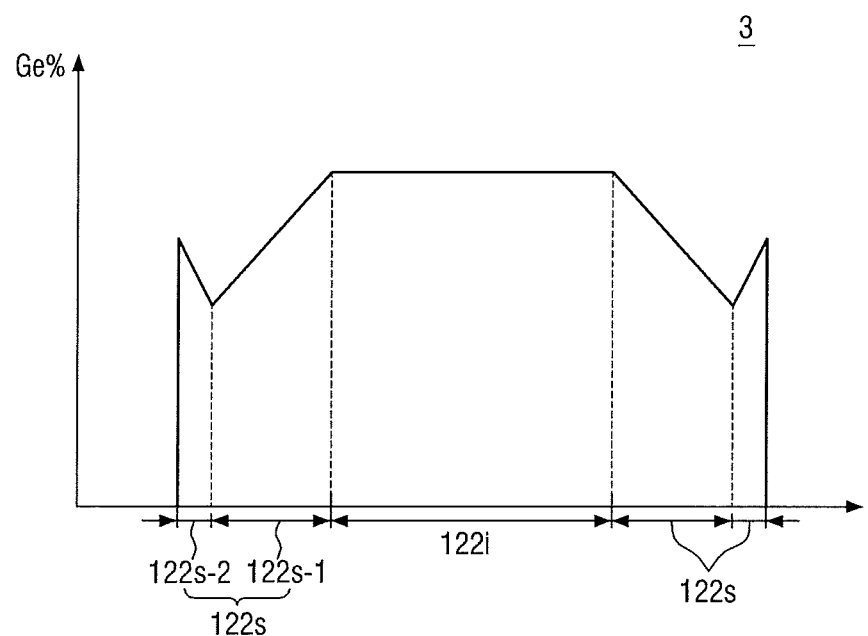
FIG. 8 is a graphical representation schematically illustrating a germanium fraction of a semiconductor device according to a third embodiment of inventive concepts.

FIG. 7 is a graphical representation schematically illustrating a germanium fraction of a semiconductor device according to a second example embodiment in accordance with principles of inventive concepts. FIG. 8 is a graphical representation schematically illustrating a germanium fraction of a semiconductor device according to a third example embodiment in accordance with principles of inventive concepts. For convenience of description, differences from the embodiment described with reference to FIGS. 1 to 6 will be mainly explained and detailed descriptions of previously described features will not be repeated here.

For reference, FIGS. 7 and 8 are graphical representations illustrating a germanium fraction in P direction of FIG. 4.

Referring to FIG. 7, in a semiconductor device 2 according to the second example embodiment in accordance with principles of inventive concepts, the outer region 122s of the upper pattern 122 may include a first part 122s-1 in which a germanium fraction decreases in a direction away from the inner region 122i of the upper pattern 122 and a second part 122s-2 in which a germanium fraction is maintained constant in a direction away from the inner region 122i of the upper pattern 122.

The first part 122s-1 of the outer region 122s of the upper pattern 122 may be defined between the inner region 122i of the upper pattern 122 and the second part 122s-2 of the outer region 122s of the upper pattern 122.

In such example embodiments, the second part 122s-2 of the outer region 122s of the upper pattern 122 may include the outer surface of the fin-type active pattern 120.

In the semiconductor device according to the second example embodiment in accordance with principles of inventive concepts, the germanium fraction of the outer region 122s of the upper pattern 122 may decrease and then be maintained constant in a direction away from the inner region 122i of the upper pattern 122.

In such example embodiments, the germanium fraction of the second part 122s-2 of the outer region 122s of the upper pattern 122 may be greater than zero.

In addition, in the semiconductor device according to the second example embodiment in accordance with principles of inventive concepts, the germanium fraction of the outer region 122s of the upper pattern 122 may be smaller than the germanium fraction of the inner region 122i of the upper pattern 122 as a whole.

Referring to FIG. 8, in a semiconductor device 3 according to the third example embodiment in accordance with principles of inventive concepts, the outer region 122s of the upper pattern 122 may include the first part 122s-1 in which a germanium fraction decreases in a direction away from the inner region 122i of the upper pattern 122 and the second part 122s-2 in which a germanium fraction increases in a direction away from the inner region 122i of the upper pattern 122.

The first part 122s-1 of the outer region 122s of the upper pattern 122 may be defined between the inner region 122i of the upper pattern 122 and the second part 122s-2 of the outer region 122s of the upper pattern 122.

In such example embodiments, the second part 122s-2 of the outer region 122s of the upper pattern 122 may include the outer surface of the fin-type active pattern 120.

In the semiconductor device according to the third example embodiment in accordance with principles of inventive concepts, the germanium fraction of the outer region 122s of the upper pattern 122 may decrease and then increase in a direction away from the inner region 122i of the upper pattern 122.

Although the germanium fraction of the outer region 122s of the upper pattern 122 is depicted as being smaller than the germanium fraction of the inner region 122i of the upper pattern 122 as a whole in FIG. 8, example embodiments in accordance with principles of inventive concepts are not limited thereto.

That is, a germanium fraction at the surface of the fin-type active pattern 120 may be greater than the germanium fraction of the inner region 122i of the upper pattern 122, for example.

As illustrated in FIGS. 7 and 8, a shape in which the germanium fraction of the outer region 122s of the upper pattern 122 is bent in the outer region 122s of the upper pattern 122 may be associated with the gate insulation layer 135 formed along a profile of the upper pattern 122.

More specifically, silicon (Si) forms an oxide layer more quickly than germanium (Ge). That is, when silicon germanium is exposed to an oxidizing atmosphere, silicon reacts with oxygen more quickly than germanium. As a result, a silicon oxide layer may be formed on a surface of the silicon germanium exposed to the oxidizing atmosphere, and the germanium may be piled up at a boundary between the silicon germanium and the silicon oxide layer.

That is, germanium may be piled up in the outer region 122s of the upper pattern 122 during a process of forming the gate insulation layer 135, thereby generating a structure such as that depicted by the graphical representations of the germanium fraction as shown in FIGS. 7 and 8.

The silicon contained in the outer region 122s of the upper pattern 122 may be scarcely consumed during the process of forming the gate insulation layer 135. In such example embodiments, the graphical representations of the germanium fraction as shown in FIGS. 5 and 6 may be generated.

Figure 9:
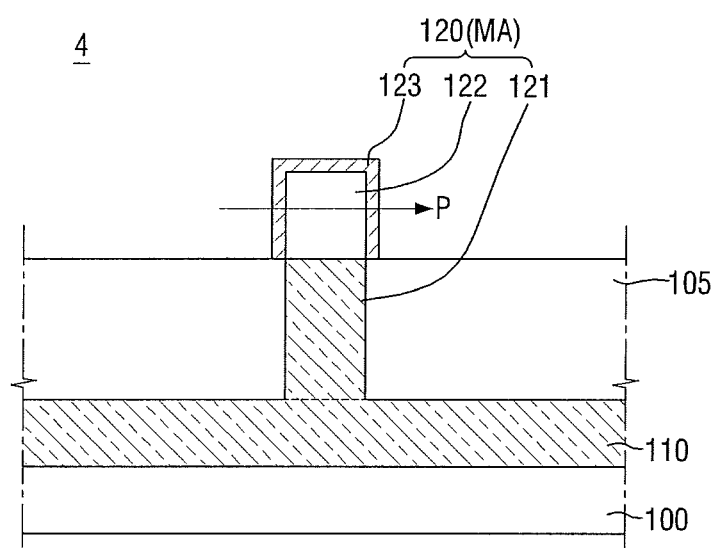
FIG. 9 is a diagram of a semiconductor device according to a fourth embodiment of inventive concepts.
Figure 10:
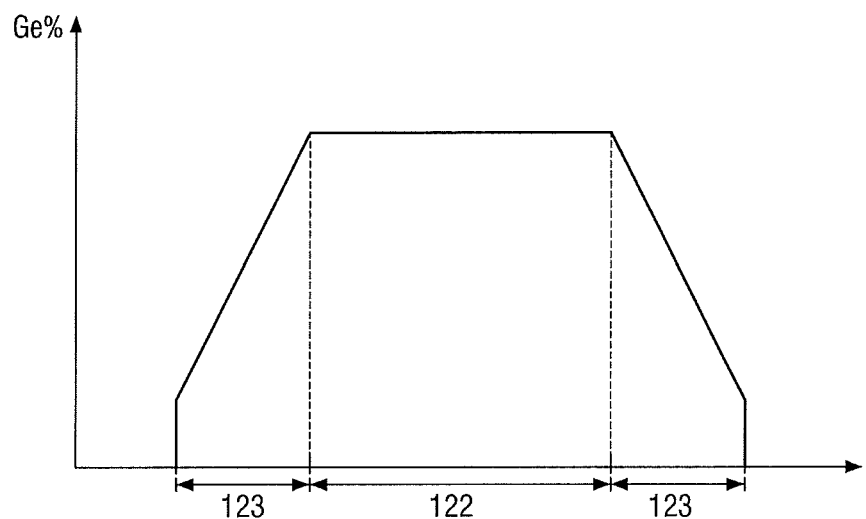
FIG. 10 is a graphical representation schematically illustrating a germanium fraction in P direction shown in FIG. 9.

FIG. 9 is a diagram of a semiconductor device according to a fourth example embodiment in accordance with principles of inventive concepts. FIG. 10 is a graphical representation schematically illustrating a germanium fraction in P direction shown in FIG. 9. For convenience of description, differences from the embodiment described with reference to FIGS. 1 to 6 will be mainly explained and detailed descriptions of previously described features will not be repeated here.

For reference, FIG. 9 is a diagram illustrating a semiconductor device excluding a gate electrode and a gate insulation layer from the diagram taken along the line B-B of FIG. 1.

Referring to FIGS. 9 and 10, in a semiconductor device 4 according to the fourth example embodiment in accordance with principles of inventive concepts, the fin-type active pattern 120 may further include a capping pattern 123.

The capping pattern 123 may be formed along the profile of the upper pattern 122. The capping pattern 123 may be formed on sidewalls and upper surface of the upper pattern 122 protruding further higher than the upper surface of the field insulation layer 105.

The capping pattern 123 may include germanium, and more particularly, may include silicon germanium.

The capping pattern 123 may be directly connected to the upper pattern 122. The capping pattern 123 may be formed to directly contact the upper pattern 122. For example, the upper pattern 122 may be a base for an epitaxial growth of the capping pattern 123, and the capping pattern 123 may be an epitaxial layer formed on the upper pattern 122.

In the semiconductor device 4 according to the fourth example embodiment in accordance with principles of inventive concepts, the germanium fraction of the upper pattern 122 may be constant. For example, the germanium fraction of the upper pattern 122 may be constant in the width direction of the fin-type active pattern 120 (the second direction Y in FIG. 1).

Additionally, the capping pattern 123 may include a part having a germanium fraction smaller than the germanium fraction of the upper pattern 122. For example, the germanium fraction of the capping pattern 123 may decrease in a direction away from the upper pattern 122.

For example, the germanium fraction of the capping pattern 123 may be smaller than the germanium fraction of the upper pattern 122 as a whole.

Although the germanium fraction at a surface of the capping pattern 123 is depicted as being greater than zero in FIG. 10, it is merely for convenience of description and example embodiments in accordance with principles of inventive concepts are not limited thereto.

In addition, although the germanium fraction of the capping pattern 123 is depicted as being linearly changed in FIG. 10, it is merely for convenience of description and example embodiments in accordance with principles of inventive concepts are not limited thereto.

Figure 11:
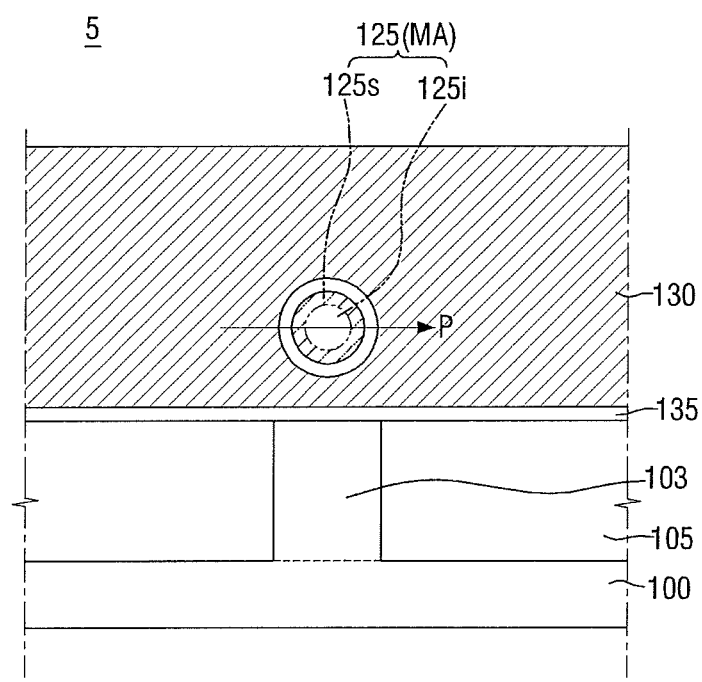
FIG. 11 is a diagram of a semiconductor device according to a fifth embodiment of inventive concepts.

FIG. 11 is a diagram of a semiconductor device according to a fifth example embodiment in accordance with principles of inventive concepts. For convenience of description, differences from the embodiment described with reference to FIGS. 1 to 6 will be mainly explained and detailed descriptions of previously described features will not be repeated here.

For reference, FIG. 11 may be a cross-sectional view taken along the line B-B of FIG. 1.

Referring to FIG. 11, in a semiconductor device 5 according to the fifth example embodiment in accordance with principles of inventive concepts, the multi-channel active pattern MA may be a wire pattern 125, for example.

The wire pattern 125 may be formed on the substrate 100. The wire pattern 125 may be spaced apart from the field insulation layer 105.

The semiconductor device 5 according to the fifth example embodiment in accordance with principles of inventive concepts may further include a protrusion pattern 103 protruding from the substrate 100.

The protrusion pattern 103 may be formed to be overlapped with the wire pattern 125. The protrusion pattern 103 may be a structure to be used to form the wire pattern 125, for example.

The protrusion pattern 103 may be a structure integral with the substrate 100 because the protrusion pattern 103 may include a material the same as that of the substrate 100 or any other material, but example embodiments in accordance with principles of inventive concepts are not limited thereto.

The gate electrode 130 may intersect the wire pattern 125 and cover the whole of the periphery of the wire pattern 125. That is, the gate electrode 130 may be interposed between the wire pattern 125 and the protrusion pattern 103, for example.

The gate insulation layer 135 may be formed along the periphery of the wire pattern 125. The gate insulation layer 135 may be formed between the gate electrode 130 and the wire pattern 125 and between the gate electrode 130 and the protrusion pattern 103.

In the semiconductor device 5 according to the fifth example embodiment in accordance with principles of inventive concepts, the wire pattern 125 may include an inner region 125i and an outer region 125s. The outer region 125s of the wire pattern 125 may be defined along the periphery of the inner region 125i of the wire pattern 125.

In other words, the outer region 125s of the wire pattern 125 may be formed along a profile of the inner region 125i of the wire pattern 125, for example.

Because the relationship between a germanium fraction of the outer region 125s of the wire pattern 125 and a germanium fraction of the inner region 125i of the wire pattern 125 is similar to the relationship between the germanium fraction of the outer region 122s of the upper pattern 122 and the germanium fraction of the inner region 122i of the upper pattern 122 described with reference to FIGS. 6 to 8, a description thereof will not be repeated here.

Figure 12:
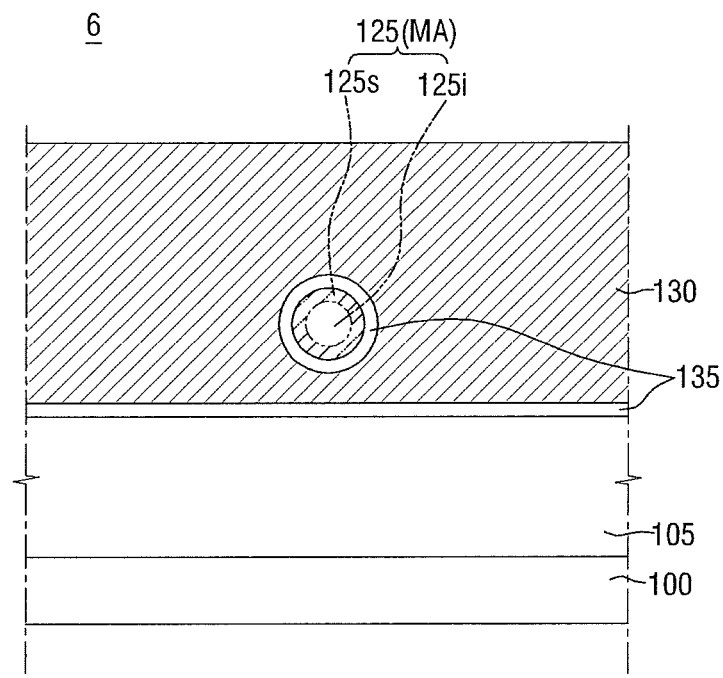
FIG. 12 is a diagram of a semiconductor device according to a sixth embodiment of inventive concepts.

FIG. 12 is a diagram of a semiconductor device according to a sixth example embodiment in accordance with principles of inventive concepts. For convenience of description, differences from the embodiment described with reference to FIG. 11 will be mainly explained and detailed descriptions of previously described features will not be repeated here.

Referring to FIG. 12, in a semiconductor device 6 according to the sixth embodiment of the present inventive concepts, the field insulation layer 105 may cover an upper surface of the substrate 100.

The substrate 100 may not include a protrusion pattern protruding from the substrate 100 and overlapped with the wire pattern 125.

That is, the wire pattern 125 may be formed on a silicon-on-insulator (SOI) or a silicon-germanium-on-insulator (SGOI), for example.

An example method of fabricating a semiconductor device in accordance with principles of inventive concepts will be explained with reference to FIG. 3 and FIGS. 13 to 16.

FIGS. 13 to 16 are diagrams illustrating intermediate process steps of an example method of fabricating a semiconductor device in accordance with principles of inventive concepts.

Figure 13:
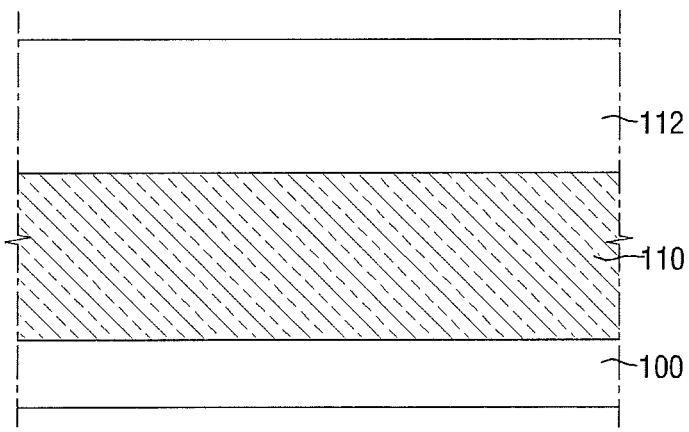
FIGS. 13 to 16 are diagrams illustrating intermediate process steps of a method of fabricating a semiconductor device according to an embodiment of inventive concepts.

Referring to FIG. 13, the strain buffer layer 110 may be formed on the substrate 100. Subsequently, a channel layer 112 may be formed on the strain buffer layer 110.

For example, the strain buffer layer 110 may be formed on the substrate 100. The strain buffer layer 110 may include a compound semiconductor, and may include, for example, a group IV-IV compound semiconductor or a group III-V compound semiconductor.

The strain buffer layer 110 may be formed through an epitaxial growth process. For example, the strain buffer layer 110 may be formed through an atmospheric pressure chemical vapor deposition (APCVD), low (or reduced) pressure chemical vapor deposition (LPCVD), ultra high vacuum chemical vapor deposition (UHV-CVD), molecular beam epitaxy (MBE), metal organic chemical vapor deposition (MOCVD), and the like, but example embodiments in accordance with principles of inventive concepts are not limited thereto.

In an example method of fabricating a semiconductor device in accordance with principles of inventive concepts, the strain buffer layer 110 is described as including silicon germanium.

The channel layer 112 may be formed on the strain buffer layer 110. The channel layer 112 may include silicon germanium. For example, a germanium fraction of the silicon germanium included in the channel layer 112 may be greater than the germanium fraction of the silicon germanium included in the strain buffer layer 110.

The channel layer 112 may be formed through, for example, an epitaxial growth process.

Figure 14:
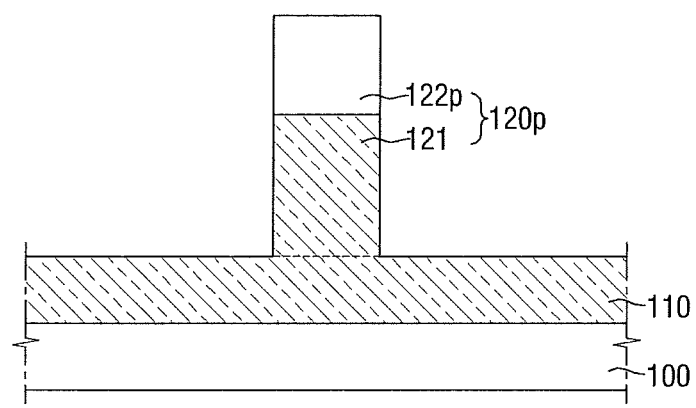

Referring to FIG. 14, a part of the strain buffer layer 110 and the channel layer 112 are patterned, to thereby form a pre fin-type active pattern 120p on the substrate 100. More specifically, the pre fin-type active pattern 120p may be formed on the strain buffer layer 110.

The pre fin-type active pattern 120p may include the lower pattern 121 and a pre upper pattern 122p. Because the lower pattern 121 may be formed by patterning a part of the strain buffer layer 110, the lower pattern 121 and the strain buffer layer 110 may form an integral structure.

The pre fin-type active pattern 120p may be formed through, for example, an etching process.

Figure 15:
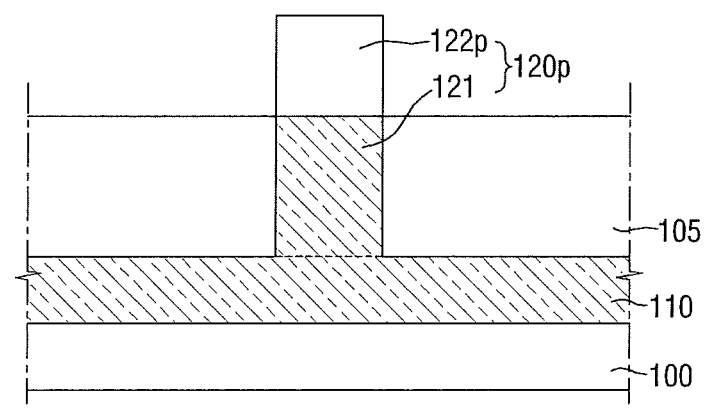

Referring to FIG. 15, the field insulation layer 105 may be formed on the substrate 100. More specifically, the field insulation layer 105 may be formed on the strain buffer layer 110.

The field insulation layer 105 may cover a part of sidewalls of the pre fin-type active pattern 120p. As a result, a part of the pre fin-type active pattern 120p may protrude further upward than the upper surface of the field insulation layer 105.

For example, the lower pattern 121 may contact the field insulation layer 105 and the pre upper pattern 122p may not contact the field insulation layer 105, example embodiments in accordance with principles of inventive concepts are not limited thereto.

Figure 16:
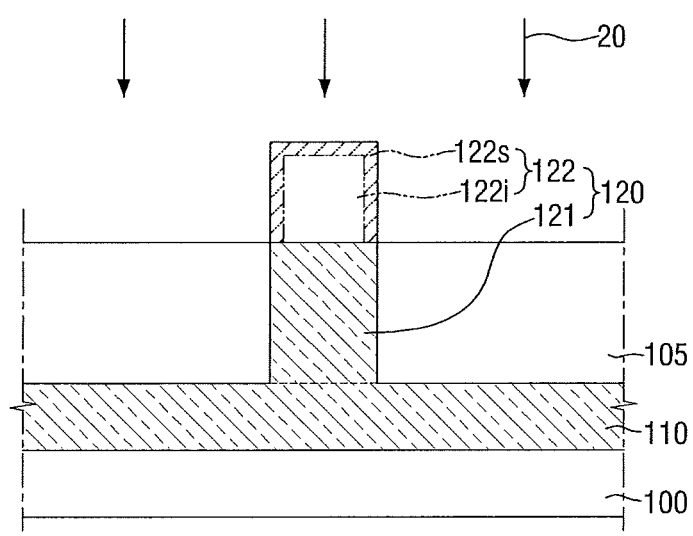

Referring to FIG. 16, germanium is removed from a surface region of the pre fin-type active pattern 120p, to thereby form the fin-type active pattern 120 on the substrate 100.

For example, the fin-type active pattern 120 may be formed by removing germanium from the surface region of the pre fin-type active pattern 120p protruding further upward than the upper surface of the field insulation layer 105. That is, the fin-type active pattern 120 may be formed by removing germanium from a surface region of the pre upper pattern 122p.

The fin-type active pattern 120 may include the lower pattern 121 and the upper pattern 122 sequentially stacked on the substrate 100. Because the lower pattern 121 is covered by the field insulation layer 105, germanium may not be removed from the surface region of the lower pattern 121.

The upper pattern 122 may include the outer region 122s and the inner region 122i. The outer region 122s of the upper pattern 122 may be formed along the profile of the inner region 122i of the upper pattern 122.

More specifically, the outer region 122s of the upper pattern 122 may be formed by removing germanium from the surface region of the pre upper pattern 122p. However, germanium may not be removed from an interior of the pre upper pattern 122p during removal of the germanium from the surface region of the pre upper pattern 122p.

The interior of the pre upper pattern 122p may become the inner region 122i of the upper pattern 122. As a result, a germanium fraction of the inner region 122i of the upper pattern 122 may be identical with a germanium fraction of the pre upper pattern 122p.

The outer region 122s of the upper pattern 122 may be formed by removing germanium from the surface region of the pre upper pattern 122p. However, the inner region 122i of the upper pattern 122 may include silicon germanium same as that of the pre upper pattern 122p. As a result, the germanium fraction of the outer region 122s of the upper pattern 122 becomes smaller than the germanium fraction of the inner region 122i of the upper pattern 122.

Removal of germanium from the surface region of the pre fin-type active pattern 120p may be performed by, for example, a hydrogen plasma annealing (HPA) process 20. That is, the fin-type active pattern 120 may be formed by performing the hydrogen plasma annealing process 20 on the pre fin-type active pattern 120p.

Hereinafter, removal of germanium from silicon germanium through a hydrogen plasma annealing process will be explained.

The reaction enthalpy may have a positive value during a process of permitting silicon from silicon germanium to react with hydrogen to produce silane ($SiH_4$). That is, in the reaction in which silicon is removed from silicon germanium to leave germanium only, an energy state of the resultant material after the reaction becomes high to cause the resultant material to move to an unstable state.

In other example embodiments, the reaction enthalpy may have a negative value during a process of permitting germanium from silicon germanium to react with hydrogen to produce germane ($GeH_4$). That is, in the reaction in which germanium is removed from silicon germanium to leave silicon, an energy state of the resultant material after the reaction becomes low to enable the resultant material to move to a stable state.

That is, in case of performing a hydrogen plasma annealing process on silicon germanium, a thermodynamically stable reaction may be enabled when germanium reacts with hydrogen to produce germane gas and leave silicon.

In this manner, germanium may be removed from silicon germanium through the hydrogen plasma annealing process.

Referring to FIG. 3, the gate insulation layer 135 and the gate electrode 130 which intersect the fin-type active pattern 120 may be formed on the substrate 100.

As described above, a part of the silicon contained in the outer region 122s of the upper pattern 122 may be consumed in the process of forming the gate insulation layer 135, thereby piling up germanium in the outer region 122s of the upper pattern 122.

Figure 17:
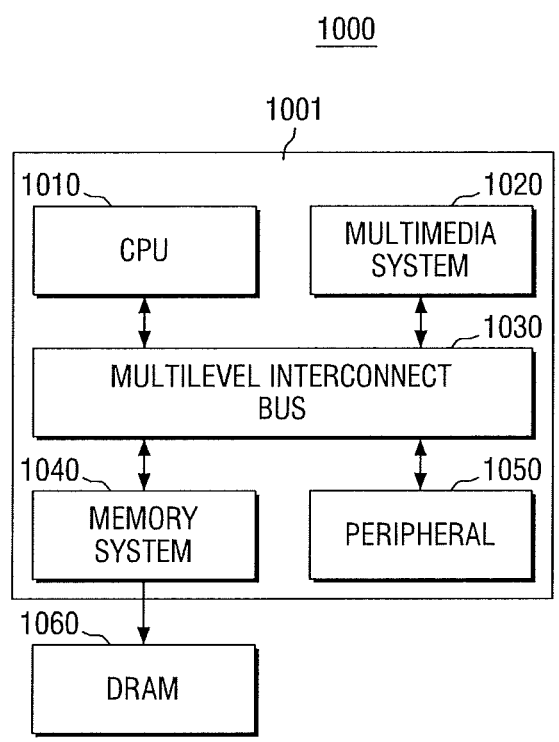
FIG. 17 is a block diagram illustrating an SoC system including semiconductor devices according to embodiments of inventive concepts.

FIG. 17 is a block diagram illustrating a SoC system including semiconductor devices according to example embodiments in accordance with principles of inventive concepts.

Referring to FIG. 17, a SoC system 1000 includes an application processor 1001 and a DRAM 1060.

The application processor 1001 may include a central processing unit 1010, a multimedia system 1020, a bus 1030, a memory system 1040 and a peripheral circuit 1050.

The central processing unit 1010 may perform an arithmetic operation required for operating the SoC system 1000. In some example embodiments in accordance with principles of inventive concepts, the central processing unit 1010 may be configured to have a multi-core environment including a plurality of cores.

The multimedia system 1020 may be used in performing various multimedia functions in the SoC system 1000. The multimedia system 1020 may include a 3D engine module, a video codec, a display system, a camera system, a post-processor, and the like.

The bus 1030 may be used in mutual data communication among the central processing unit 1010, the multimedia system 1020, the memory system 1040 and the peripheral circuit 1050. In some embodiments of the present inventive concepts, the bus 1030 may have a multi-layer structure. That is, examples of the bus 1030 may include a multi-layer advanced high-performance bus (AHB) or a multi-layer advanced extensible interface (AXI), but example embodiments in accordance with principles of inventive concepts are not limited thereto.

The memory system 1040 may provide an environment required for enabling the application processor 1001 to be connected to an external memory (for example, DRAM 1060) and operate at high speed. In some example embodiments in accordance with principles of inventive concepts, the memory system 1040 may include a separate controller (for example, a DRAM controller) for controlling an external memory (for example, DRAM 1060).

The peripheral circuit 1050 may provide an environment required for enabling the SoC system 1000 to be smoothly connected to an external device (for example, a main board), for example. As a result, the peripheral circuit 1050 may include various interfaces for compatibility of the external device connected to the SoC system 1000.

The DRAM 1060 may serve as an operation memory required for operating the application processor 1001. In some embodiments of the present inventive concepts, the DRAM 1060 may be arranged outside the application processor 1001 as shown in the drawing. For example, the DRAM 1060 may be packaged with the application processor 1001 into a package on package system.

At least one of the components of the SoC system 1000 may include at least one of the above-described semiconductor devices according to example embodiments in accordance with principles of inventive concepts.

Figure 18:
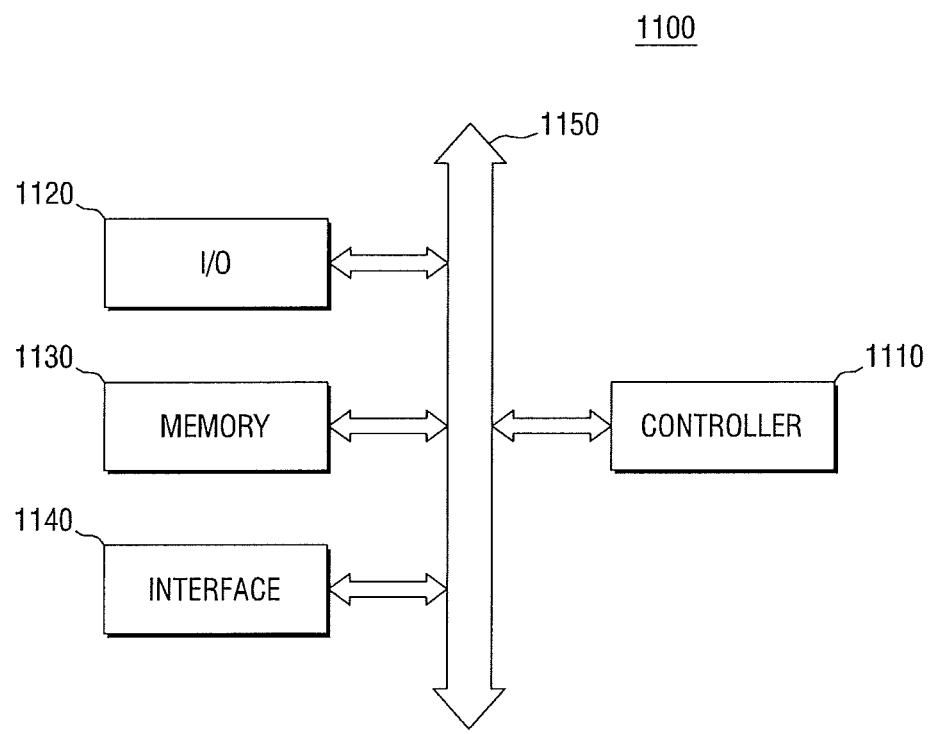
FIG. 18 is a block diagram illustrating an electronic system including semiconductor devices according to embodiments of inventive concepts.

FIG. 18 is a block diagram illustrating an electronic system including a semiconductor device according to example embodiments in accordance with principles of inventive concepts.

Referring to FIG. 18, an electronic system 1100 according to an example embodiment in accordance with principles of inventive concepts may include a controller 1110, an input/output (I/O) device 1120, a memory device 1130, an interface 1140 and a bus 1150. The controller 1110, the input/output device 1120, the memory device 1130 and/or the interface 1140 may be coupled with each other via the bus 1150. The bus 1150 may serve as a path for movement of data.

The controller 1110 may include at least one of a microprocessor, a digital signal processor, a microcontroller, and logic elements capable of performing functions similar to those of the microprocessor, the digital signal processor, and the microcontroller. The input/output device 1120 may include a keypad, a keyboard, a display device and the like. The memory device 1130 may store therein data and/or instructions and the like. The interface 1140 may perform the function of transmitting data to a communication network or receiving data from the communication network. The interface 1140 may be of a wired or wireless type. For example, the interface 1140 may include an antenna, a wired/wireless transceiver or the like.

Although not shown, the electronic system 1100 may further include a high speed DRAM and/or SRAM or the like as an operation memory for improving an operation of the controller 1110.

The aforementioned semiconductor device according to example embodiments in accordance with principles of inventive concepts may be provided within the memory device 1130, or provided as a part of the controller 1110, the input/output device 1120 and the like, for example.

The electronic system 1100 can be applied to a personal digital assistant (PDA), a portable computer, a web tablet, a wireless phone, a mobile phone, a digital music player, a memory card, or all electronic products that can transmit and/or receive information in a wireless environment.

Figure 19:
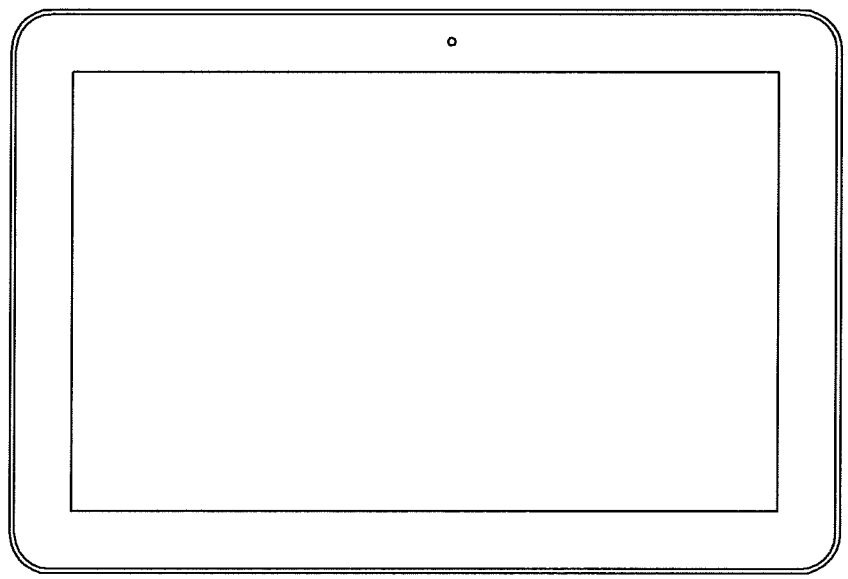
FIGS. 19 to 21 are diagrams illustrating examples of semiconductor systems to which semiconductor devices according to embodiments of inventive concepts can be applied.
Figure 20:
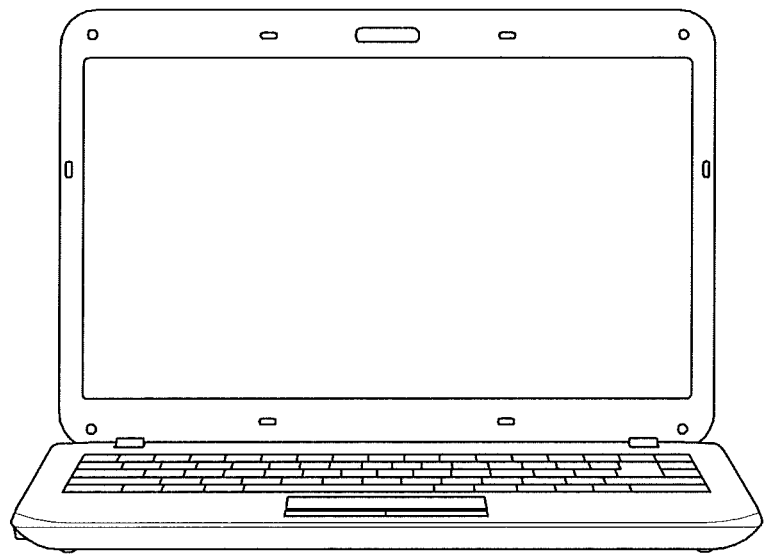
Figure 21:
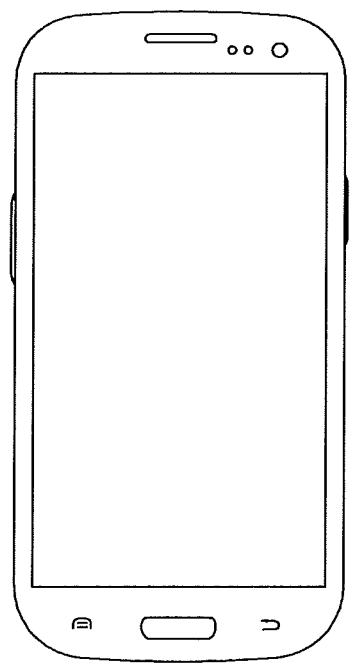

FIGS. 19 to 21 are diagrams illustrating examples of semiconductor systems to which semiconductor devices according to example embodiments in accordance with principles of inventive concepts may be applied.

FIG. 19 illustrates a tablet PC 1200, FIG. 20 illustrates a notebook computer 1300 and FIG. 21 illustrates a smart phone 1400. The aforementioned semiconductor devices according to example embodiments in accordance with principles of inventive concepts can be used in the tablet PC 1200, the notebook computer 1300, the smart phone 1400, and the like.

In addition, it may be apparent to those skilled in the art that the above-described semiconductor devices according to example embodiments in accordance with principles of inventive concepts can be applied to other integrated circuit devices that are not illustrated herein.

That is, as examples of semiconductor systems according to embodiments of the present inventive concepts, the table PC 1200, the notebook computer 1300 and the smart phone 1400 are particularly described, examples of semiconductor systems according to example embodiments in accordance with principles of inventive concepts are not limited thereto.

In some embodiments of the present inventive concepts, semiconductor systems can be realized as a computer, an ultra mobile PC (UMPC), a workstation, a net-book, a personal digital assistant (PDA), a portable computer, a wireless phone, a mobile phone, an e-book), a portable multimedia player (PMP), a portable gaming console, a navigation device, a black box, a digital camera, a 3-dimensional television, a digital audio recorder, a digital audio player, a digital picture recorder, a digital picture player, a digital video recorder, a digital video player, and the like, for example.

While the present inventive concepts has been particularly shown and described with reference to example embodiments thereof, it will be understood by those of ordinary skill in the art that various changes in form and details may be made therein without departing from the spirit and scope of inventive concepts. It is therefore desired that the present embodiments be considered in all respects as illustrative and not restrictive, reference being made to the appended claims rather than the foregoing description to indicate the scope of inventive concepts.

What is claimed is:

1. A semiconductor device comprising:
    a compound semiconductor layer including silicon germanium;
    a multi-channel active pattern including germanium and an inner region and an outer region on the compound layer, the outer region being formed along a profile of the inner region, wherein a germanium fraction of the outer region is smaller than a germanium fraction of the inner region; and
    a gate electrode intersecting the multi-channel active pattern,
    wherein a germanium fraction of the compound semiconductor layer is smaller than the germanium fraction of the inner region.

2. The semiconductor device of claim 1, wherein the germanium fraction of the outer region decreases in a direction away from the inner region.

3. The semiconductor device of claim 1, wherein the outer region includes an epitaxial layer formed along the profile of the inner region.

4. The semiconductor device of claim 1, wherein the germanium fraction of the inner region is constant in a width direction of the multi-channel active pattern.

5. The semiconductor device of claim 1, wherein the multi-channel active pattern includes silicon germanium.

6. The semiconductor device of claim 1, wherein the multi-channel active pattern is a fin-type active pattern.

7. The semiconductor device of claim 1, wherein the outer region includes first and a second parts,
wherein the first part of the outer region is interposed between the inner region and the second part of the outer region, and
wherein a germanium fraction of the first part of the outer region decreases in a direction away from the inner region.

8. The semiconductor device of claim 7, wherein a germanium fraction of the second part of the outer region increases in a direction away from the inner region.

9. The semiconductor device of claim 7, wherein the germanium fraction of the second part of the outer region is constant.

10. A semiconductor device comprising:
a compound semiconductor layer including silicon germanium;
a silicon germanium fin-type pattern that protrudes from the compound semiconductor layer and that includes an inner region and an outer region, the outer region being formed along a profile of the inner region; and
a gate electrode intersecting the silicon germanium fin-type pattern on the compound semiconductor layer,
wherein a germanium fraction of the inner region is constant, and a germanium fraction of the outer region is smaller than the germanium fraction of the inner region, and
wherein a germanium fraction of the compound semiconductor layer is smaller than the germanium fraction of the inner region.

11. The semiconductor device of claim 10, wherein the germanium fraction of the outer region continuously decreases in a direction away from the inner region.

12. The semiconductor device of claim 10, wherein the outer region includes first and second parts,
wherein the first part of the outer region is interposed between the inner region and the second part of the outer region, and
wherein a germanium fraction of the first part of the outer region decreases in a direction away from the inner region.

13. The semiconductor device of claim 12, wherein a germanium fraction of the second part of the outer region increases in a direction away from the inner region.

14. The semiconductor device of claim 10, further comprising a field insulation layer formed on the compound semiconductor layer,
wherein at least a part of the silicon germanium fin-type pattern protrudes further upward than an upper surface of the field insulation layer.

15. The semiconductor device of claim 14, wherein the outer region is formed along the profile of the inner region that protrudes further upward than the upper surface of the field insulation layer.

16. A semiconductor device comprising:
a compound semiconductor layer including silicon germanium;
a silicon germanium fin-type pattern that protrudes from the compound semiconductor layer and includes a lower pattern and an upper pattern sequentially stacked, the upper pattern including an inner region and an outer region formed along a profile of the inner region; and
a gate electrode intersecting the silicon germanium fin-type pattern on the compound semiconductor layer,
wherein a germanium fraction of the inner region is constant, and the outer region includes a part having a germanium fraction smaller than the germanium fraction of the inner region, and
wherein a germanium fraction of the lower pattern is smaller than the germanium fraction of the inner region.

17. The semiconductor device of claim 16, wherein a germanium fraction of the outer region continuously decreases in a direction away from the inner region.

18. The semiconductor device of claim 16, wherein the germanium fraction of the outer region decreases and then increases in a direction away from the inner region.

* * * * *